US011276695B2

(12) United States Patent
Ching et al.

(10) Patent No.: US 11,276,695 B2
(45) Date of Patent: Mar. 15, 2022

(54) MULTI-GATE DEVICE AND RELATED METHODS

(71) Applicant: Taiwan Semiconductor Manufacturing Co., Ltd., Hsinchu (TW)

(72) Inventors: Kuo-Cheng Ching, Hsinchu County (TW); Ching-Wei Tsai, Hsinchu (TW); Kuan-Lun Cheng, Hsin-Chu (TW); Chih-Hao Wang, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/437,643

(22) Filed: Jun. 11, 2019

(65) Prior Publication Data
US 2020/0020692 A1    Jan. 16, 2020

Related U.S. Application Data

(60) Provisional application No. 62/698,634, filed on Jul. 16, 2018.

(51) Int. Cl.
*H01L 27/092* (2006.01)
*H01L 29/78* (2006.01)
*H01L 29/66* (2006.01)

(52) U.S. Cl.
CPC .... *H01L 27/0924* (2013.01); *H01L 29/66795* (2013.01); *H01L 29/785* (2013.01); *H01L 2029/7858* (2013.01)

(58) Field of Classification Search
None
See application file for complete search history.

(56) References Cited

U.S. PATENT DOCUMENTS

| 8,796,666 | B1 | 8/2014 | Huang et al. |
| 8,815,712 | B2 | 8/2014 | Wan et al. |
| 8,963,258 | B2 | 2/2015 | Yu et al. |
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,362,355 | B1* | 6/2016 | Cheng ............... H01L 29/78696 |
| 9,520,482 | B1 | 12/2016 | Chang et al. |
| 9,548,303 | B2 | 1/2017 | Lee et al. |
| 9,576,814 | B2 | 2/2017 | Wu et al. |
| 2017/0005195 | A1* | 1/2017 | Ching ................... H01L 29/165 |

(Continued)

*Primary Examiner* — Khaja Ahmad
(74) *Attorney, Agent, or Firm* — Haynes and Boone, LLP

(57) ABSTRACT

A method for fabricating a semiconductor device includes providing a fin in a first region of a substrate. The fin includes a plurality of a first type of epitaxial layers and a plurality of a second type of epitaxial layers. A portion of a layer of the second type of epitaxial layers in a channel region of the first fin is removed to form a first gap between a first layer of the first type of epitaxial layers and a second layer of the first type of epitaxial layers. A first portion of a first gate structure is formed within the first gap and extending from a first surface of the first layer of the first type of epitaxial layers to a second surface of the second layer of the first type of epitaxial layers. A first source/drain feature is formed abutting the first portion of the first gate structure.

20 Claims, 14 Drawing Sheets

(56) References Cited

U.S. PATENT DOCUMENTS

2017/0040321 A1* 2/2017 Mitard .............. H01L 29/66439
2018/0294331 A1* 10/2018 Cho ................... H01L 29/0653
2019/0081169 A1* 3/2019 Zhou ................. H01L 21/0228
2019/0393351 A1* 12/2019 Beattie .............. H01L 29/66742

* cited by examiner

MULTI-GATE DEVICE AND RELATED METHODS

CROSS-REFERENCE TO RELATED APPLICATION

This application claims the benefit of U.S. Provisional Application No. 62/698,634, filed Jul. 16, 2018, the entirety of which is incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA devices get their name from the gate structure which extends completely around the channel, providing better electrostatic control than FinFETs. FinFETs and GAA devices are compatible with conventional complementary metal-oxide-semiconductor (CMOS) processes and their three-dimensional structure allows them to be aggressively scaled while maintaining gate control and mitigating SCEs. In general, GAA devices may be implemented, for example, in cases where FinFETs can no longer meet performance requirements. However, GAA device fabrication can be challenging, and current methods continue to face challenges with respect to both device fabrication and performance. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9C, 9D, 9E, 9F, 10C, 10D, 10E, 10F, 11C, 11D, 11E, 11F, 12C, 12D, 12E, 12F, and 12G are cross-sectional views of an embodiment of a device 200 according to aspects of the method of FIG. 1.

DETAILED DESCRIPTION

Figure 1:
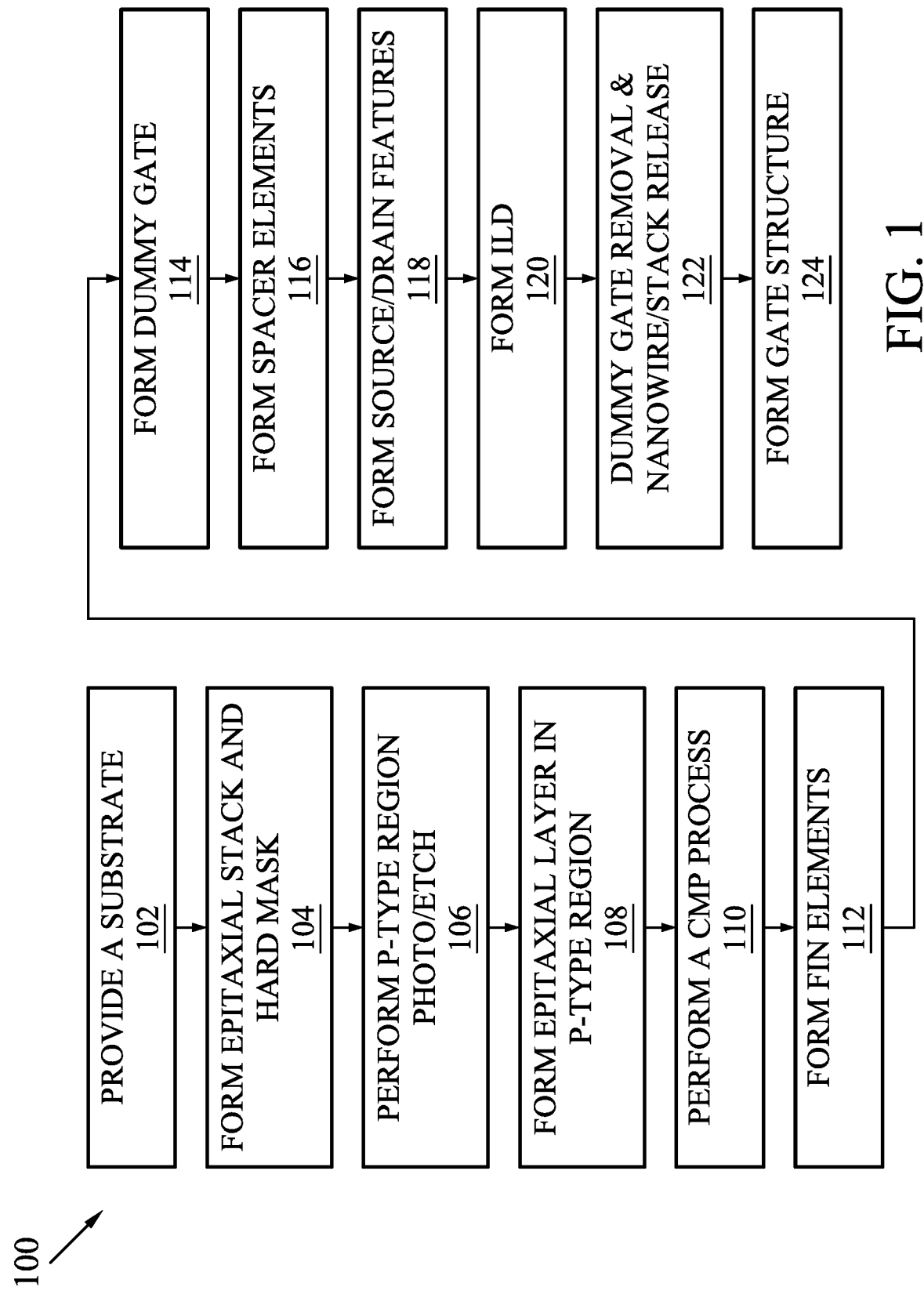
FIG. 1 is a flow chart of a method of fabricating a multi-gate device or portion provided according to one or more aspects of the present disclosure.
Figure 3:
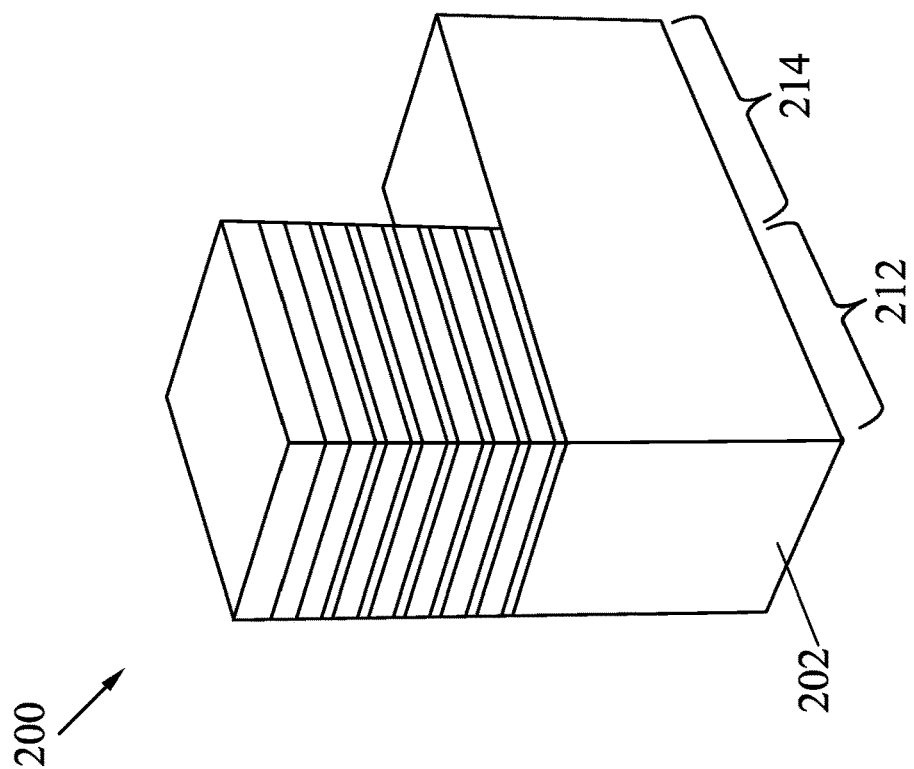
FIGS. 2, 3, 4, 5, 6A, 6B, 7A, 7B, 8A, 8B, 9A, 9B, 10A, 10B, 11A, 11B, 12A, and 12B are isometric views of an embodiment of a device 200 according to aspects of the method of FIG. 1.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanowire channel(s), bar-shaped channel(s), and/or other suitable channel configuration. Presented herein are embodiments of devices that may have one or more channel regions (e.g., nanowires) associated with a single, contiguous gate structure. However, one of ordinary skill would recognize that the teaching can apply to a single channel (e.g., single nanowire) or any number of channels. One of ordinary skill may recognize other examples of semiconductor devices that may benefit from aspects of the present disclosure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for improving a device short-channel effect for advanced transistor structures. Generally, some of the key process challenges of at least some current methods include Si or SiGe nanowire/nanosheet formation, inner spacer formation, and metal gate (MG) gap-fill and design. Problems associated with the inner spacer (e.g., defects/voids in the source/drain epitaxial layer), in particular, should be addressed to enhance device performance. In accordance with embodiments of the present disclosure, a process flow and device structure are provided that include a nanowire or nanosheet device for N-type devices (NFETs) and a SiGe FinFET for P-type devices (PFETS). To be sure, in some embodiments, PFET devices may include a nanowire or nanosheet device, and NFET devices may include FinFET devices. In some embodiments, both NFET and PFET devices may include nanowire or nanosheet devices. In particular, aspects of the present disclosure provide for process flow simplification and performance optimization. For example, to address at least some existing inner spacer and metal gate issues, as noted above, embodiments of the present disclosure provide for interfacial layer (IL)/high-K dielectric (HK) merging between nanowires. This eliminates the need for an inner spacer and mitigates some key problems associated with inner spacers. Stated another way, in some embodiments, the spacing between adjacent nanowires/nanosheets may include a merged IL/HK layer without a dedicated spacer layer, thereby simplifying the process flow and enhancing device performance. Other embodiments and advantages will be evident to those skilled in the art upon reading the present disclosure.

Illustrated in FIG. 1 is a method 100 of semiconductor fabrication including fabrication of multi-gate devices. As used herein, the term "multi-gate device" is used to describe a device (e.g., a semiconductor transistor) that has at least some gate material disposed on multiple sides of at least one channel of the device. In some examples, the multi-gate device may be referred to as a GAA device having gate material disposed on at least four sides of at least one channel of the device. The channel region may be referred to as a "nanowire," which as used herein includes channel regions of various geometries (e.g., cylindrical, bar-shaped) and various dimensions. Additionally, in some examples, the multi-gate device may include a FinFET device, or a FinFET device formed in combination with a GAA device. It is understood that the method 100 includes steps having features of a complementary metal-oxide-semiconductor (CMOS) technology process flow and thus, are only described briefly herein. Additional steps may be performed before, after, and/or during the method 100.

FIGS. 2-5, 6A/6B, 7A/7B, 8A/8B, 9A/9B, 10A/10B, 11A/11B, and 12A/12B are isometric views of an embodiment of a semiconductor device 200 according to various stages of the method 100 of FIG. 1. FIGS. 9C, 10C, 11C, and 12C are cross-section views, corresponding to respective isometric views listed above, of an embodiment of the semiconductor device 200 along a first cut X1-X1', the first cut being parallel to a channel of an N-type nanowire/nanosheet. FIGS. 9D, 10D, 11D, and 12D are cross-section views, corresponding to respective isometric views listed above, of an embodiment of the semiconductor device 200 along a second cut X2-X2', the second cut being parallel to a channel of a P-type FinFET. FIGS. 9E, 10E, 11E, and 12E are cross-section views, corresponding to respective isometric views listed above, of an embodiment of the semiconductor device 200 along a third cut Y1-Y1', the third cut being perpendicular to the channel of the N-type nanowire/nanosheet. FIGS. 9F, 10F, 11F, and 12F are cross-section views, corresponding to respective isometric views listed above, of an embodiment of the semiconductor device 200 along a fourth cut Y2-Y2', the fourth cut being perpendicular to the channel of the P-type FinFET.

It is understood that parts of the semiconductor device 200 may be fabricated by a CMOS technology process flow, and thus some processes are only briefly described herein. Further, the semiconductor device 200 may include various other devices and features, such as other types of devices such as additional transistors, bipolar junction transistors, resistors, capacitors, inductors, diodes, fuses, static random-access memory (SRAM) and/or other logic circuits, etc., but is simplified for a better understanding of the inventive concepts of the present disclosure. In some embodiments, the semiconductor device 200 includes a plurality of semiconductor devices (e.g., transistors), including PFETs, NFETs, etc., which may be interconnected. Moreover, it is noted that the process steps of method 100, including any descriptions given with reference to the figures are merely exemplary and are not intended to be limiting beyond what is specifically recited in the claims that follow. By way of illustration, while the example figures shown and described below with reference to the method 100 include devices having an N-type GAA device and a complementary P-type FinFET device formed on the same substrate, it will be understood that other device configurations are possible. For example, in some embodiments, the method 100 may be used to fabricate devices having an N-type FinFET device and a complementary P-type GAA device. Alternatively, in some cases, the method 100 may be used to fabricate devices having an N-type GAA device and a complementary P-type GAA device.

The method 100 begins at block 102 where a substrate is provided. Referring to the example of FIG. 2, in an embodiment of block 102, a substrate 202 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., N wells, P wells) may be formed on the substrate 202 in regions designed for different device types such as an N-type region 212 designed for N-type transistors and a P-type region 214 designed for P-type transistors. The different doping profiles may include ion implantation of dopants and/or diffusion processes. The substrate 202 typically has isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features.

In an embodiment of the method 100, in block 102, an anti-punch through (APT) implant is performed. The APT implant may be performed in a region underlying the channel region of a device for example, to prevent punch-through or unwanted diffusion. In some embodiments, one or more APT implants may be performed, for example, for each of an N-type device region and a P-type device region.

Returning to FIG. 1, the method 100 then proceeds to block 104 where one or more epitaxial layers are grown on the substrate, and where a hard mask is formed over the epitaxial layers. With reference to the example of FIG. 2, in an embodiment of block 104, an epitaxial stack 204 is formed over the substrate 202. The epitaxial stack 204 includes epitaxial layers 206 of a first composition interposed by epitaxial layers 208 of a second composition. The first and second composition can be different. In an embodiment, the epitaxial layers 206 are SiGe and the epitaxial layers 208 are silicon (Si). However, other embodiments are possible including those that provide for a first composition and a second composition having different oxidation rates and/or etch selectivity. In some embodiments, for example when the epitaxial layer 206 includes SiGe and where the epitaxial layer 208 includes Si, the Si oxidation rate of the epitaxial layer 208 is less than the SiGe oxidation rate of the epitaxial layer 206.

The epitaxial layers 208 or portions thereof may form a channel region of a GAA transistor of the device 200. For example, the epitaxial layers 208 may be referred to as "nanowires" used to form a channel region of a GAA device, such as an N-type GAA device formed in the N-type region 212, as discussed below. These "nanowires" are also used to form portions of the source/drain features of the GAA device, as discussed below. Again, as the term is used herein, "nanowires" refers to semiconductor layers that are cylindrical in shape as well as other configurations such as, bar-shaped. The use of the epitaxial layers 208 to define a channel or channels of a device is further discussed below.

Figure 2:
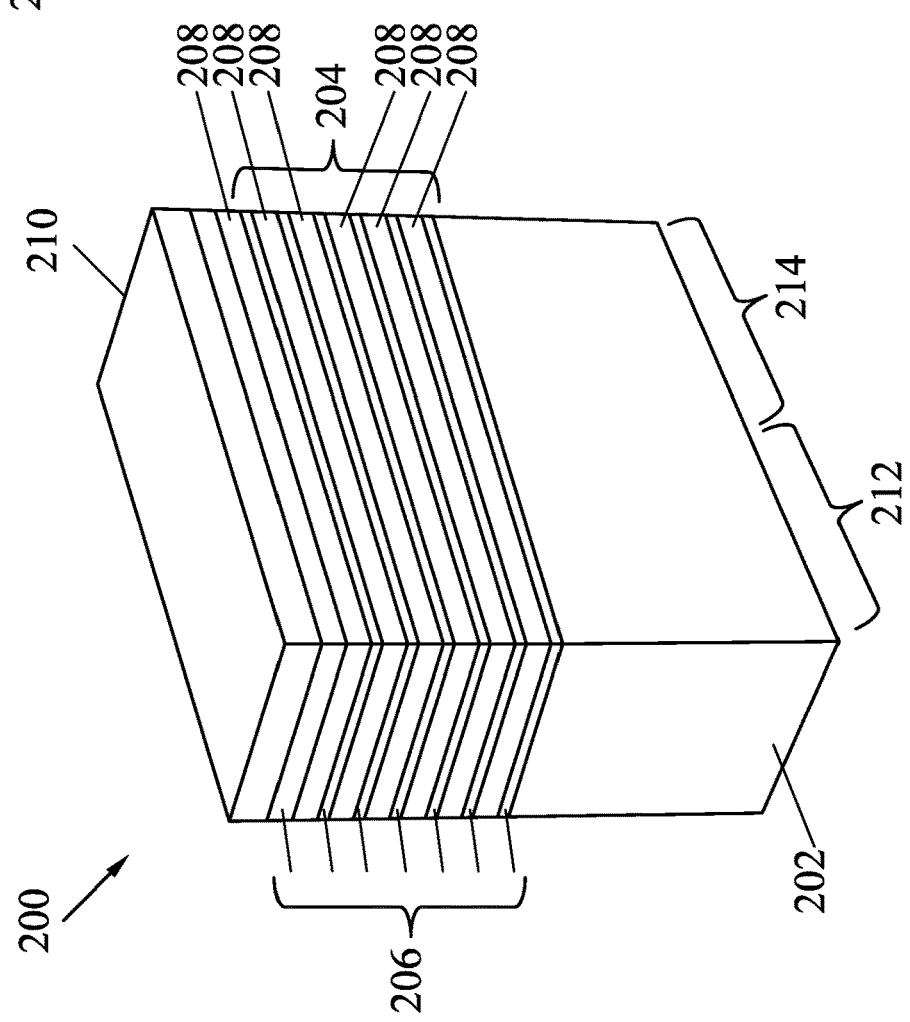
Figure 5:
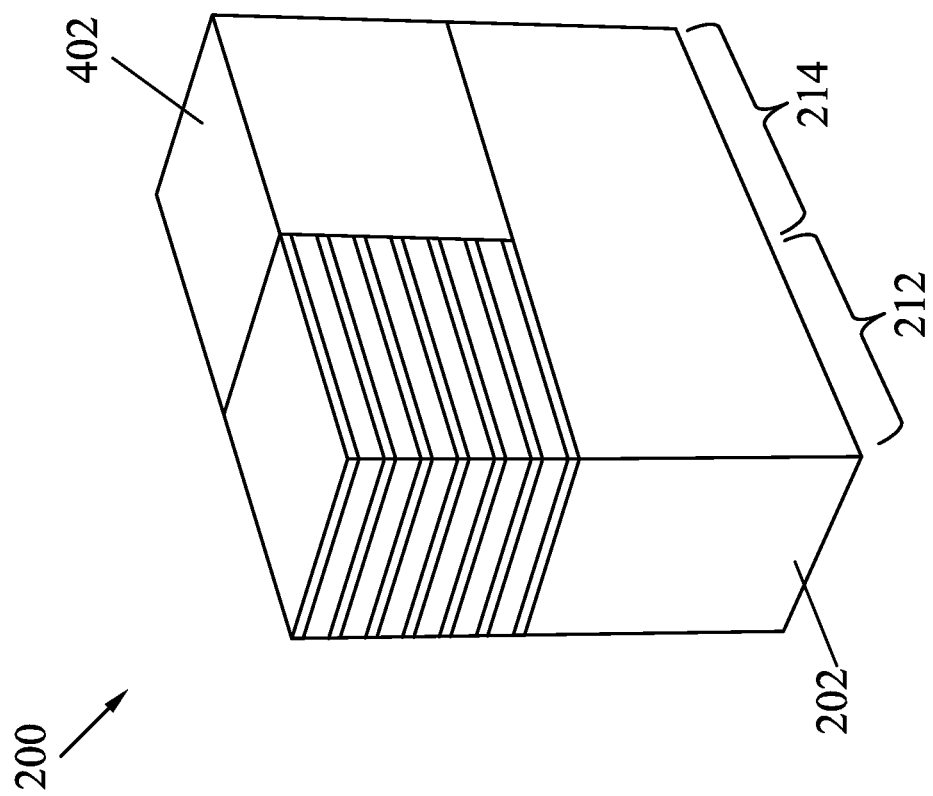
Figure 4:
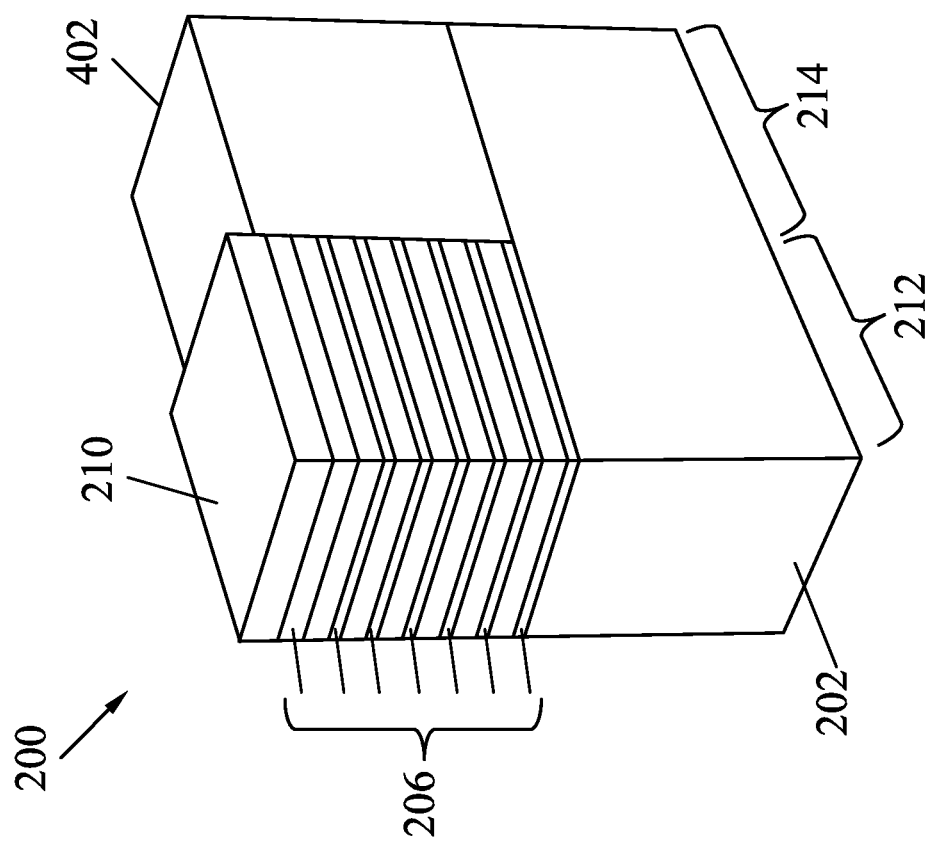

It is noted that seven (7) layers of the epitaxial layer 206 and six (6) layers of the epitaxial layer 208 are illustrated in FIG. 2, this is for illustrative purposes only and not intended to be limiting beyond what is specifically recited in the claims. It can be appreciated that any number of epitaxial layers can be formed in the epitaxial stack 204; the number of layers depending on the desired number of channel regions for the GAA device. In some embodiments, the number of epitaxial layers 208 is between 4 and 10.

In some embodiments, the epitaxial layer 206 has a thickness range of about 4-8 nanometers (nm). In some embodiments, the epitaxial layers 206 may be substantially uniform in thickness. However, in some cases, a topmost layer of the epitaxial layers 206 may be thicker than the remaining epitaxial layers 206, for example, to mitigate layer loss that may occur to the topmost layer of the epitaxial layers 206 during a subsequent CMP process, as described below. In some embodiments, the epitaxial layer 208 has a thickness range of about 5-8 nm. In some embodiments, the epitaxial layers 208 of the stack are substantially uniform in thickness. As described in more detail below, the epitaxial layer 208 may serve as channel region(s) for a subsequently-formed multi-gate device (e.g., a GAA device) and its thickness chosen based on device performance considerations. The epitaxial layer 206 may serve to define a gap distance between adjacent channel region(s) for the subsequently-formed multi-gate device and its thickness chosen based on device performance considerations.

By way of example, epitaxial growth of the layers of the epitaxial stack 204 may be performed by a molecular beam epitaxy (MBE) process, a metalorganic chemical vapor deposition (MOCVD) process, and/or other suitable epitaxial growth processes. In some embodiments, the epitaxially grown layers such as, the layers 208 include the same material as the substrate 202. In some embodiments, the epitaxially grown layers 206, 208 include a different material than the substrate 202. As stated above, in at least some examples, the epitaxial layer 206 includes an epitaxially grown silicon germanium (SiGe) layer and the epitaxial layer 208 includes an epitaxially grown silicon (Si) layer. Alternatively, in some embodiments, either of the epitaxial layers 206, 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 206, 208 may be chosen based on providing differing oxidation, etch rates, and/or etch selectivity properties. In various embodiments, the epitaxial layers 206, 208 are substantially dopant-free (i.e., having an extrinsic dopant concentration from about 0 $cm^{-3}$ to about $1\times10^{17}$ $cm^{-3}$), where for example, no intentional doping is performed during the epitaxial growth process.

Still referring to FIG. 2, in a further embodiment of block 104, a hard mask (HM) 210 may be formed over the epitaxial stack 204. In some embodiments, the HM layer 210 includes an oxide layer (e.g., a pad oxide layer that may include $SiO_2$) and nitride layer (e.g., a pad nitride layer that may include $Si_3N_4$) formed over the oxide layer. In some examples, the oxide layer may include thermally grown oxide, CVD-deposited oxide, and/or ALD-deposited oxide, and the nitride layer may include a nitride layer deposited by CVD or other suitable technique. By way of example, the oxide layer may have a thickness of between approximately 5 nm and approximately 40 nm. In some embodiments, the nitride layer may have a thickness of between approximately 20 nm and approximately 160 nm.

The method 100 then proceeds to block 106 where a P-type region photolithography and etch process is performed. Referring to the example of FIGS. 2 and 3, an embodiment of block 106 is shown. In some embodiments, a photolithography (photo) step is performed to form a patterned photoresist (resist) layer that exposes the P-type region 214. For example, in some embodiments, performing the photo step may include forming a resist layer over the device 200, exposing the resist to a pattern (e.g., P-type region mask), performing post-exposure bake processes, and developing the resist to form a patterned resist layer. In some embodiments, after formation of the patterned resist layer, an etching process is performed to etch the HM layer 210 and the epitaxial stack 204 within the P-type region 214, while the N-type region 212 remains masked by the patterned resist layer. In some examples, the etching process may include a wet etch, a dry etch, or a combination thereof. In addition, in some embodiments, one or more different etch chemistries may be used to effectively etch each of the HM layer 210 and the epitaxial layers 206, 208 of the epitaxial stack 204. In some examples, the etching process may proceed until the underlying substrate 202 within the P-type region 214 is exposed. After the etching process, the resist layer may be removed, for example, by way of a solvent, resist stripper, ashing, or other suitable technique.

The method 100 then proceeds to block 108 where an epitaxial layer is grown on the substrate in the P-type region. With reference to the example of FIGS. 3 and 4, in an embodiment of block 108, an epitaxial layer 402 is formed over the substrate 202 within the P-type region 214. In some embodiments, the epitaxial layer 402 includes SiGe; however, other embodiments are possible. In embodiments where the epitaxial layer 402 includes SiGe, a percentage of Ge in the SiGe may be between about 0-35%. The epitaxial layer 402 or portions thereof may form a channel region of a FinFET of the device 200. For example, the epitaxial layer 402 may be used to form a channel region of a P-type FinFET device formed in the P-type region 214, as discussed below. The epitaxial layer 402 or portions thereof may also be used to form portions of the source/drain features of the FinFET device, as discussed below. The use of the epitaxial layer 402 to define a channel or channels of a device is further discussed below.

Similar to layers of the epitaxial stack 204, epitaxial growth of the epitaxial layer 402 may be performed by an MBE process, an MOCVD process, and/or other suitable epitaxial growth processes. In some embodiments, the epitaxial layer 402 may include the same material as the substrate 202. In some embodiments, the epitaxial layer 402 may include a different material than the substrate 202. As stated above, in at least some examples, the epitaxial layer 402 includes an epitaxially grown silicon germanium (SiGe) layer. Alternatively, in some embodiments, the epitaxial layer 402 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In various embodiments, the epitaxial layer 402 is substantially dopant-free (i.e., having an extrinsic dopant concentration from about 0 cm$^{-3}$ to about 1×10$^{17}$ cm$^{-3}$), where for example, no intentional doping is performed during the epitaxial growth process.

The method 100 proceeds to block 110 where a chemical mechanical polishing (CMP) process is performed. With reference to the example of FIGS. 4 and 5, in an embodiment of block 110, a CMP process is performed. In some embodiments, the CMP process removes the HM layer 210 from the N-type region 212 and planarizes a top surface of the device 200. In some cases, a top portion of the epitaxial layer 402 may also be removed during the CMP process. In some embodiments, and as noted above, a portion of the topmost layer of the epitaxial layers 206 may be removed during the CMP process.

Figure 6B:
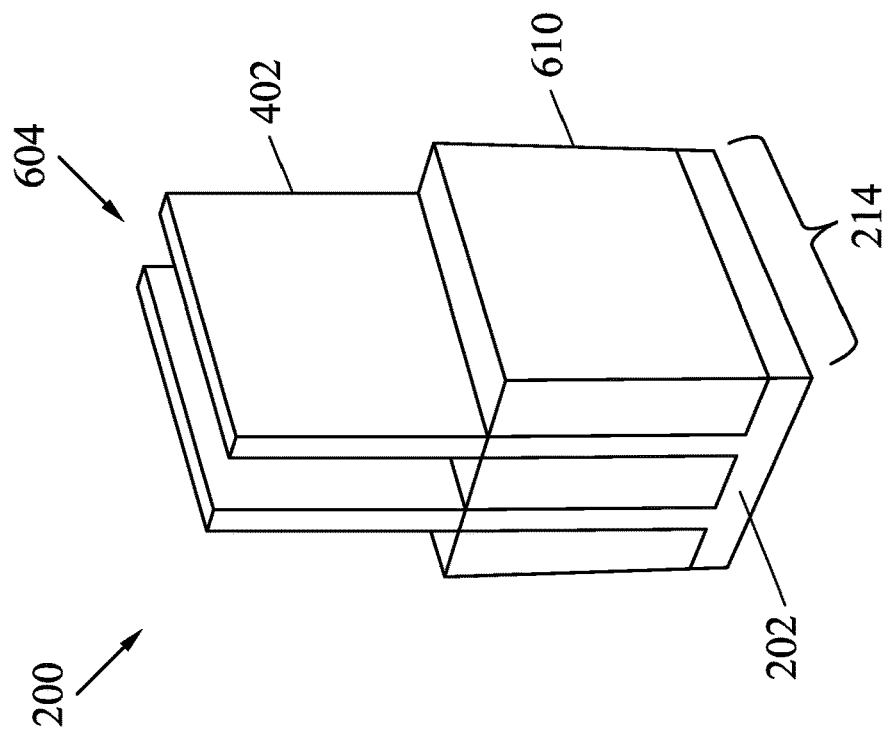
Figure 6A:
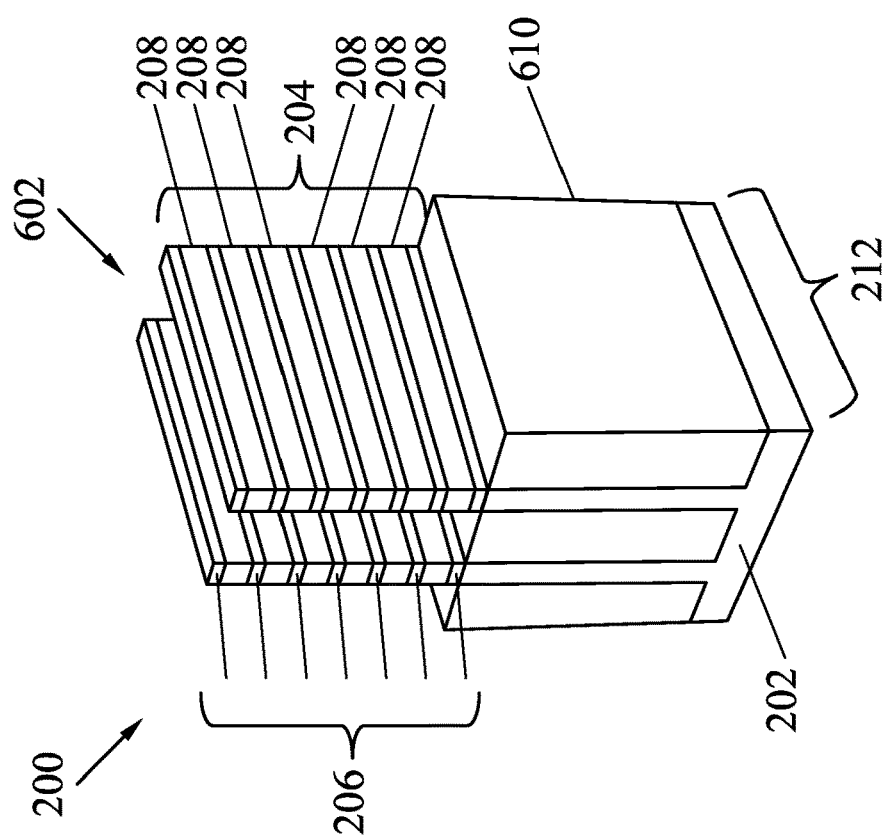

The method 100 then proceeds to block 112 where fin elements are patterned and formed. With reference to the example of FIGS. 5, 6A, and 6B, in an embodiment of block 112, a plurality of fin elements 602, 604 extending from the substrate 202 are formed. In particular, a plurality of fin elements 602 are formed in the N-type region 212 (FIG. 6A), and a plurality of fin elements 604 are formed in the P-type region 214 (FIG. 6B). In various embodiments, each of the fin elements 602 includes a substrate portion formed from the substrate 202, and portions of each of the epitaxial layers of the epitaxial layer stack 204 including epitaxial layers 206 and 208. In some embodiments, each of the fin elements 604 includes a substrate portion formed from the substrate 202, and a portion of the epitaxial layer 402. In some embodiments, a fin width of the fin elements 604 is equal to about 3-5 nm, and a fin height of the fin elements 604 is equal to about 40-60 nm. In some examples, the nanowires (epitaxial layers 208) of the fin elements 602 may have a first dimension (e.g., parallel to a plane defined by a fin 602) equal to about 5-8 nm, and a second dimension (e.g., perpendicular to the plane defined by a fin 602) equal to about 5-14 nm.

The fin elements 602 and 604 may be fabricated using suitable processes including photolithography and etch processes. The photolithography process may include forming a photoresist layer over the substrate 202 (e.g., over the device 200 of FIG. 5), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers formed thereupon, while an etch process (i) forms trenches in unprotected regions through the epitaxial layers 206, 208 and into the substrate 202, in the N-type region 212, thereby leaving the plurality of extending fins 602, and (ii) forms trenches in unprotected regions through the epitaxial layer 402 and into the substrate 202, in the P-type region 214, thereby leaving the plurality of extending fins 604. The trenches may be etched using a dry etch (e.g., reactive ion etching), a wet etch, and/or other suitable processes. In various embodiments, the trenches may be filled with a dielectric material forming, for example, shallow trench isolation features interposing the fins.

In some embodiments, the dielectric layer used to fill the trenches may include SiO$_2$, silicon nitride, silicon oxynitride, fluorine-doped silicate glass (FSG), a low-k dielectric, combinations thereof, and/or other suitable materials known in the art. In various examples, the dielectric layer may be deposited by a CVD process, a subatmospheric CVD (SACVD) process, a flowable CVD process, an ALD process, a PVD process, and/or other suitable process. In some embodiments, after deposition of the dielectric layer, the device 200 may be annealed, for example, to improve the quality of the dielectric layer. In some embodiments, the dielectric layer (and subsequently formed STI features 602) may include a multi-layer structure, for example, having one or more liner layers.

In some embodiments of forming the isolation (STI) features, after deposition of the dielectric layer, the deposited dielectric material is thinned and planarized, for example by a CMP process. The CMP process may planarize the top surface of the device 200 to form the STI features 602. In various embodiments, the STI features 602 interposing the fin elements are then recessed. Referring to the example of FIGS. 6A and 6B, the STI features 602 are recessed such that the fins 602, 604 extend above the STI features 602. In some embodiments, the recessing process may include a dry etching process, a wet etching process, and/or a combination thereof. In some embodiments, a recessing depth is controlled (e.g., by controlling an etching time) so as to result in a desired height 'H' of the exposed upper portion of the fin elements 602, 604. In some embodiments, the height 'H' exposes each of the layers of the epitaxy stack 204 and substantially all of the epitaxial layer 402.

Numerous other embodiments of methods to form the fins on the substrate may also be used including, for example, defining the fin region (e.g., by mask or isolation regions) and epitaxially growing the epitaxial stack 204, and/or the epitaxial layer 402, in the form of the fin elements. In some embodiments, forming the fins may include a trim process to decrease the width of the fins. The trim process may include wet or dry etching processes.

The method 100 then proceeds to block 114 where sacrificial layers/features are formed and in particular, a dummy gate structure. While the present discussion is directed to a replacement gate (gate-last) process whereby a dummy gate structure is formed and subsequently replaced, other configurations may be possible.

Figure 7B:
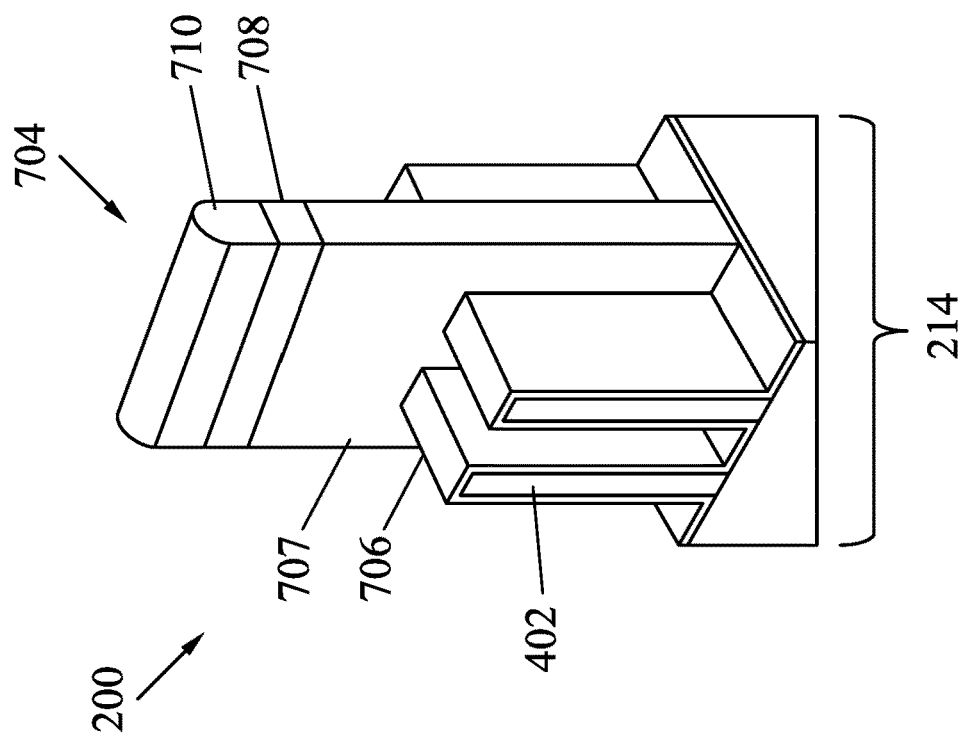
Figure 7A:
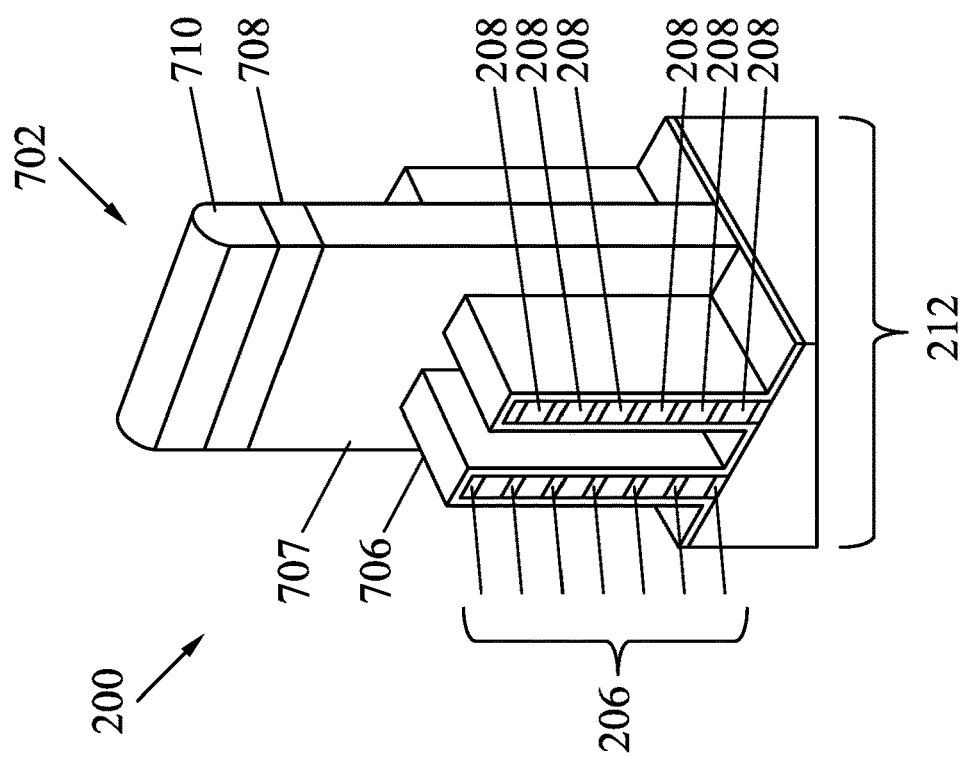

With reference to FIGS. 7A and 7B, in an embodiment of block 114, a gate stack 702 is formed over the fin elements 602 in the N-type region 212, and a gate stack 704 is formed over the fin elements 604 in the P-type region 214. In an embodiment, the gate stacks 702, 704 are dummy (sacrificial) gate stacks that are subsequently removed as discussed with reference to block 122 of the method 100.

In some embodiments, prior to forming the gate stacks 702, 704, a dielectric layer 706 may be formed. In some embodiments, the dielectric layer 706 is deposited over the substrate 202 and over the fins 602, 604, including within trenches between adjacent fins 602, 604. In some embodiments, the dielectric layer 706 may include $SiO_2$, silicon nitride, a high-K dielectric material or other suitable material. In various examples, the dielectric layer 706 may be deposited by a CVD process, a subatmospheric CVD (SACVD) process, a flowable CVD process, an ALD process, a PVD process, or other suitable process. By way of example, the dielectric layer 706 may be used to prevent damage to the fin elements 602, 604 by subsequent processing (e.g., subsequent formation of the dummy gate).

In some embodiments using a gate-last process, the gate stacks 702, 704 are dummy gate stacks and will be replaced by the final gate stack at a subsequent processing stage of the device 200. In particular, the gate stacks 702, 704 may be replaced at a later processing stage by a high-K dielectric layer (HK) and metal gate electrode (MG). In some embodiments, the gate stacks 702, 704 are formed over the substrate 202 and are at least partially disposed over the fin elements 602, 604. Additionally, in various embodiments, the gate stacks 702, 704 are formed over the dielectric layer 706, which was deposited as described above prior to formation of the gate stacks 702, 704. The portion of the fin elements 602, 604 underlying the gate stacks 702, 704 may be referred to as the channel region. The gate stacks 702, 704 may also define a source/drain region of the fin elements 602, 604, for example, the regions of the fin elements adjacent to and on opposing sides of the channel region.

In some embodiments, the gate stacks 702, 704 include a dielectric layer and an electrode layer, both of which are represented by element 707. The gate stacks 702, 704 may also include one or more hard mask layers 708, 710. In some embodiments, the hard mask layer 708 may include an oxide layer, and the hard mask layer 710 may include a nitride layer. In some embodiments, the gate stacks 702, 704 are formed by various process steps such as layer deposition, patterning, etching, as well as other suitable processing steps. In some examples, the layer deposition process includes CVD (including both low-pressure CVD and plasma-enhanced CVD), PVD, ALD, thermal oxidation, e-beam evaporation, or other suitable deposition techniques, or a combination thereof. In forming the gate stack for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

In some embodiments, the dielectric layer of the gate stacks 702, 704 includes silicon oxide. Alternatively, or additionally, the dielectric layer of the gate stacks 702, 704 may include silicon nitride, a high-K dielectric material or other suitable material. In some embodiments, the electrode layer of the gate stacks 702, 704 may include polycrystalline silicon (polysilicon). In some embodiments, the oxide of the hard mask layer 708 includes a pad oxide layer that may include $SiO_2$. In some embodiments, the nitride of the hard mask layer 710 includes a pad nitride layer that may include $Si_3N_4$, silicon oxynitride or silicon carbide.

The method 100 then proceeds to block 116 where a spacer material layer is deposited on the substrate. The spacer material layer may be a conformal layer that is subsequently etched back to form spacer elements on sidewalls of the gate stacks.

Figure 8B:
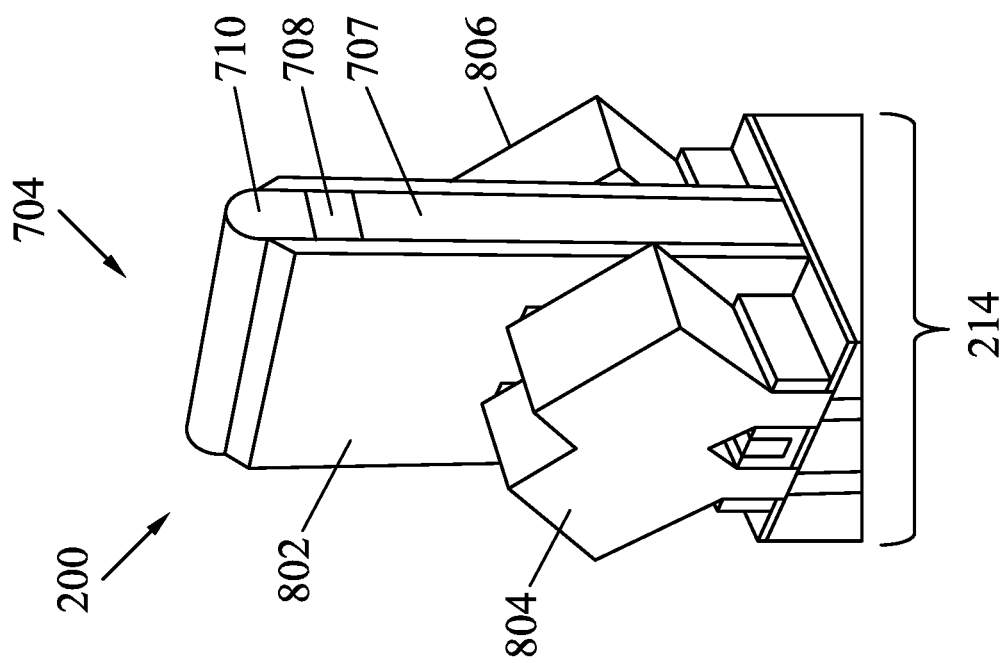
Figure 8A:
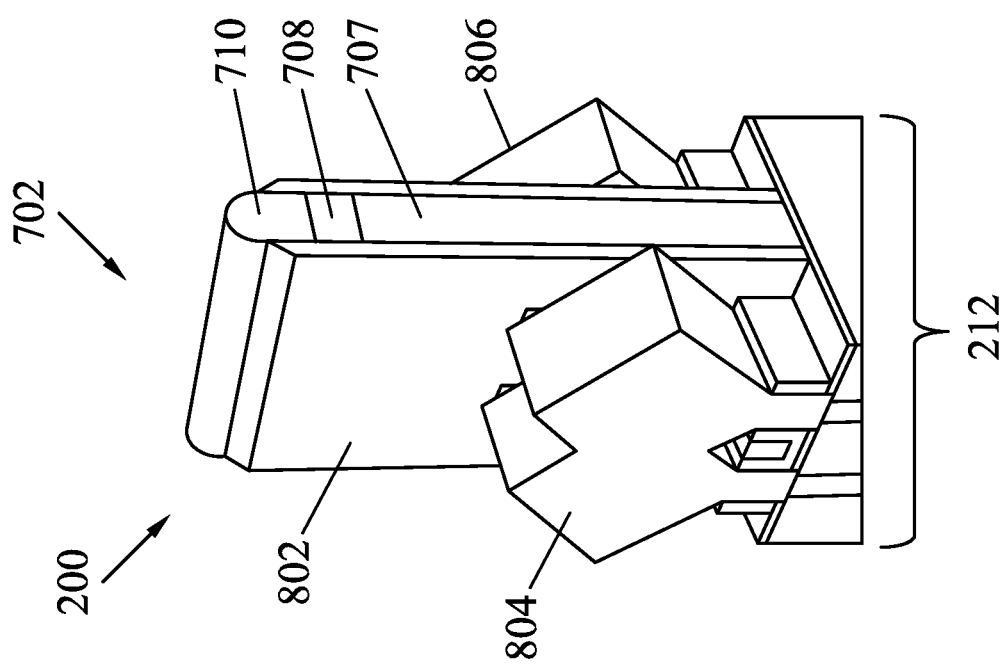
Figure 9B:
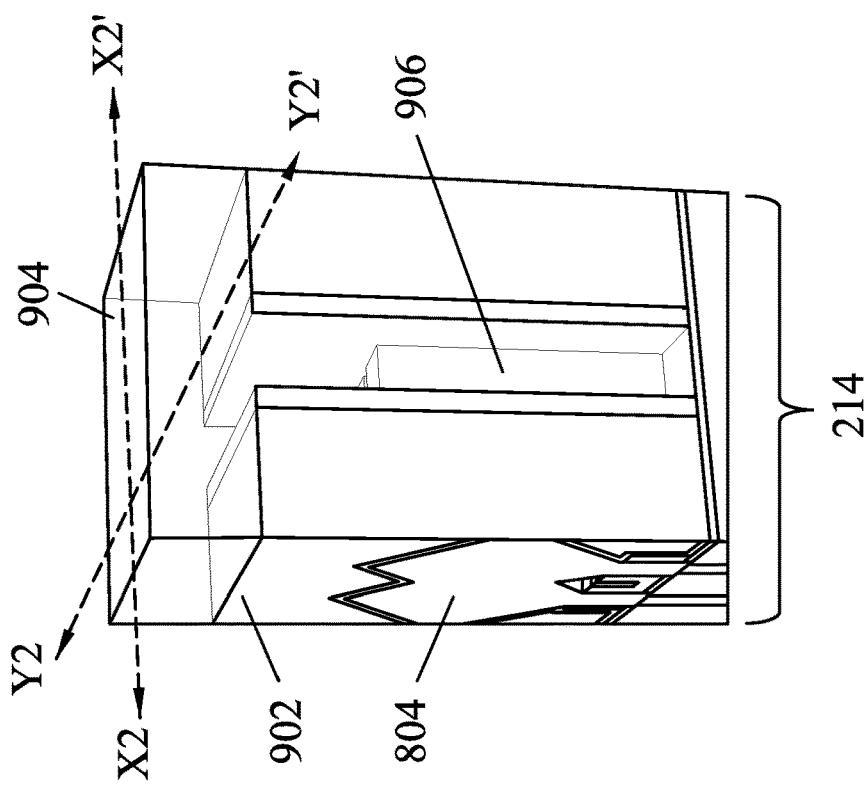
Figure 9A:
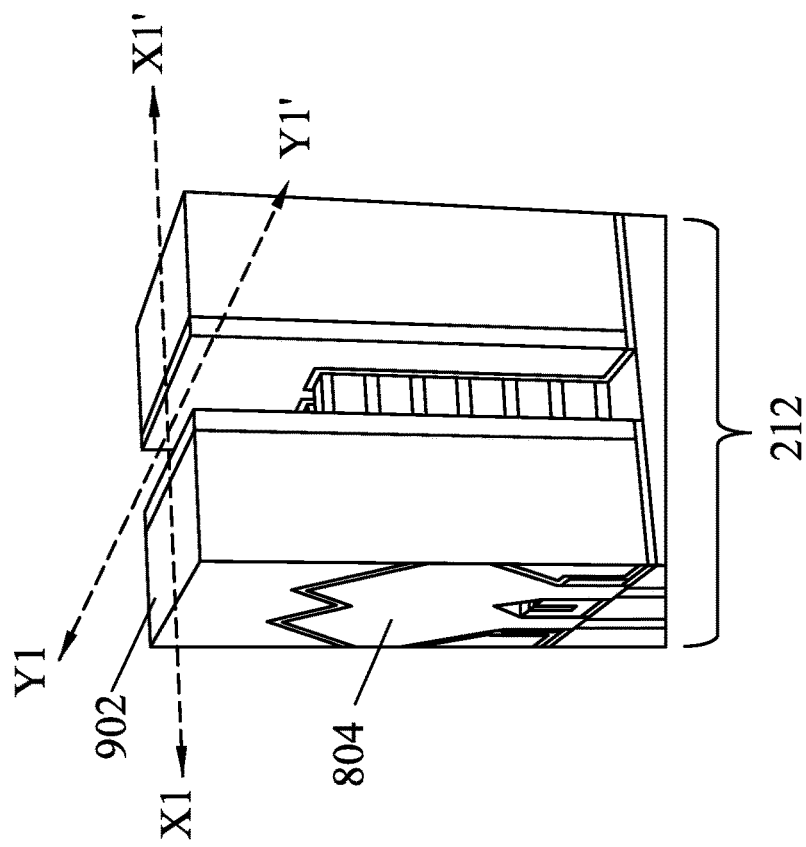
Figure 9C:
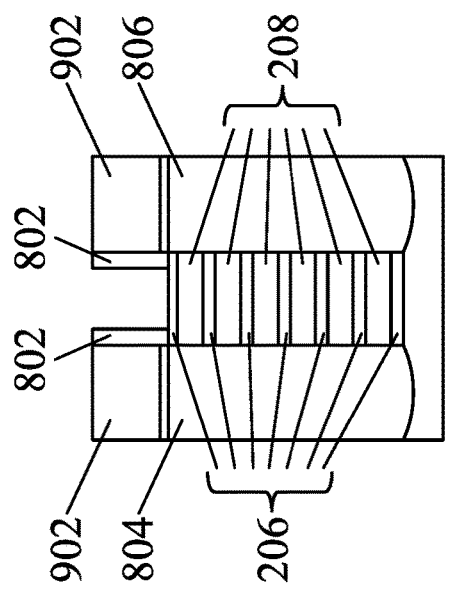
Figure 9D:
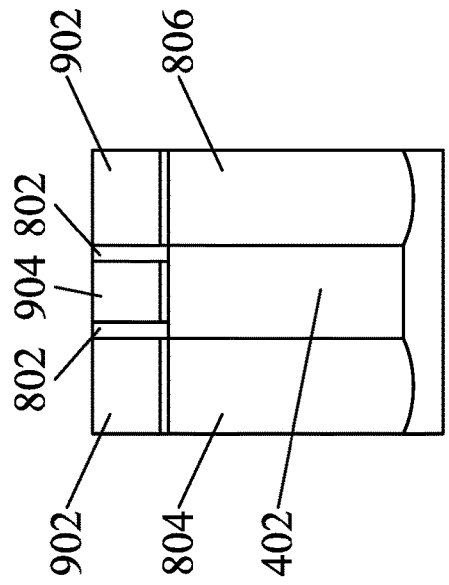
Figure 9E:
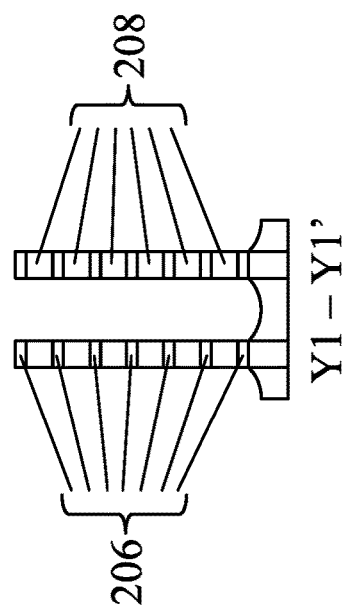
Figure 9F:
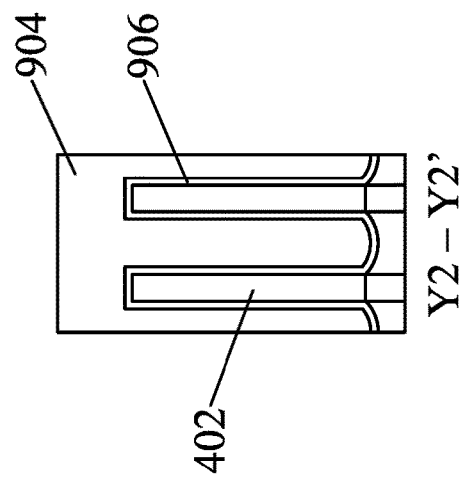

With reference to FIGS. 8A and 8B, in an embodiment of block 116, sidewall spacers 802 are formed on the sidewalls of the gate stacks 702, 704. Formation of the sidewall spacers 802 may include depositing a spacer material layer on the substrate 202. In some examples, the deposited spacer material layer may include a dielectric material such as silicon oxide, silicon nitride, silicon carbide, silicon oxynitride, SiCN films, silicon oxycarbide, SiOCN films, and/or combinations thereof. In some embodiments, the spacer material layer includes multiple layers, such as main spacer walls, liner layers, and the like. By way of example, the spacer material layer may be formed by depositing a dielectric material over the gate stacks 702, 704 using processes such as, CVD process, a subatmospheric CVD (SACVD) process, a flowable CVD process, an ALD process, a PVD process, or other suitable process.

In some embodiments, the deposition of the spacer material layer is followed by an etching back (e.g., anisotropically) of the dielectric spacer material. Referring to the example of FIGS. 8A and 8B, after formation of the spacer material layer, the spacer material layer may be etched-back to expose portions of the fin elements 602, 604 adjacent to and not covered by the gate stacks 702, 704 (e.g., source/drain regions). The spacer layer material may remain on the sidewalls of the gate stacks 702, 704 forming sidewall spacers 802. In some embodiments, etching-back of the spacer material layer may include a wet etch process, a dry etch process, a multiple-step etch process, and/or a combination thereof. The spacer material layer may be removed from a top surface of the exposed epitaxial stack 204 and the epitaxial layer 402, and from the lateral surfaces of the exposed epitaxial stack 204 and the epitaxial layer 402, for example, in source/drain regions adjacent to the gate stacks 702, 704. The spacer layer may also be removed from a top surface of the gate stacks 702, 704, as illustrated in FIGS. 8A and 8B.

The method 100 then proceeds to block 118 where source/drain features are formed. Initially, in an embodiment of block 118, after formation of the gate stacks 702, 704 and/or the sidewall spacers 802, the dielectric layer 706 (FIGS. 7A/7B) may be etched-back to expose portions of the fin elements 602, 604 not covered by the gate stacks 702, 704 (e.g., for example, in source/drain regions), and including portions of the epitaxial layers 206, 208, and 402. In some examples, the dielectric layer 706 may be etched-back substantially to the underlying STI 602. In some embodiments, etching-back of the dielectric layer 706 may include a wet etch process, a dry etch process, a multiple-step etch process, and/or a combination thereof. Thus, preserving the dielectric layer 706 during formation of the gate stacks 702, 704 serves to effectively protect the fin elements 602, 604 during such processing.

Referring to the example of FIGS. 8A and 8B, in a further embodiment of block 118, source/drain features 804, 806 are formed in source/drain regions adjacent to and on either side of the gate stacks 702, 704. In some embodiments, the source/drain features 804, 806 are formed by epitaxially growing a semiconductor material layer on the exposed fin elements 602, 604 in the source/drain regions.

In various embodiments, the semiconductor material layer grown to form the source/drain features 804, 806 may include Ge, Si, GaAs, AlGaAs, SiGe, GaAsP, SiP, or other suitable material. The source/drain features 804, 806 may be formed by one or more epitaxial (epi) processes. In some embodiments, the source/drain features 804, 806 may be in-situ doped during the epi process. For example, in some embodiments, epitaxially grown SiGe source/drain features may be doped with boron. In some cases, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features 804, 806 are not in-situ doped, and instead an implantation process is performed to dope the source/drain features 804, 806. In some embodiments, formation of the source/drain features 804, 806 may be performed in separate processing sequences for each of N-type and P-type source/drain features (e.g., in each of the N-type region 212 and the P-type region 214).

The method 100 then proceeds to block 120 where an inter-layer dielectric (ILD) layer is formed. Referring to the example of FIGS. 9A, 9B, 9C, and 9D, in an embodiment of block 120, an ILD layer 902 is formed over the substrate 202. In some embodiments, a contact etch stop layer (CESL) is formed over the substrate 202 prior to forming the ILD layer 902. In some examples, the CESL includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. In some embodiments, the ILD layer 902 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 902 may be deposited by a PECVD process or other suitable deposition technique. In some embodiments, after formation of the ILD layer 902, the semiconductor device 200 may be subject to a high thermal budget process to anneal the ILD layer.

In some examples, after depositing the ILD (and/or CESL or other dielectric layers), a planarization process may be performed to expose a top surface of the gate stacks 702, 704. For example, a planarization process includes a CMP process which removes portions of the ILD layer 902 (and CESL layer, if present) overlying the gate stacks 702, 704 and planarizes a top surface of the semiconductor device 200. In addition, the CMP process may remove the hard mask layers 708, 710 overlying the gate stacks 702, 704 to expose the underlying electrode layer, such as a polysilicon electrode layer, of the dummy gate.

The method 100 proceeds to block 122 where the dummy gate (see block 114) is removed. In some cases, a dummy gate electrode (e.g., such as a polysilicon gate electrode) of the dummy gate may initially be removed from both the N-type region 212 and the P-type region 214, by suitable etching processes, as illustrated in the example of FIGS. 9A, 9B, 9C, 9D, 9E, and 9F. In some embodiments, a dummy gate oxide of the dummy gate may remain disposed over the fin elements 602, 604 after removal of the dummy gate electrode. Thereafter, in an embodiment of block 122, an N-type region 212 photolithography patterning process is performed to form a patterned photoresist (resist) layer 904 that exposes the N-type region 212. For example, in some embodiments, performing the photo step may include forming a resist layer over the device 200, exposing the resist to a pattern (e.g., N-type region mask), performing post-exposure bake processes, and developing the resist to form the patterned resist layer 904. In some embodiments, after formation of the patterned resist layer 904, an etching process is performed to etch the remaining dummy gate oxide disposed over the fin elements 602 within the N-type region 212, while the P-type region 214 remains masked by the patterned resist layer 904 and the dummy gate oxide (e.g., an oxide layer 906) remains disposed over the fin elements 604 within the P-type region 214. In some examples, the etching process may include a wet etch, a dry etch, or a combination thereof.

After the etching of the remaining dummy gate oxide disposed over the fin elements 602 within the N-type region 212, and in a further embodiment of block 122, the patterned resist layer 904 is removed. In some cases, the patterned resist layer 904 may be removed by way of a solvent, resist stripper, ashing, or other suitable technique.

Figure 10B:
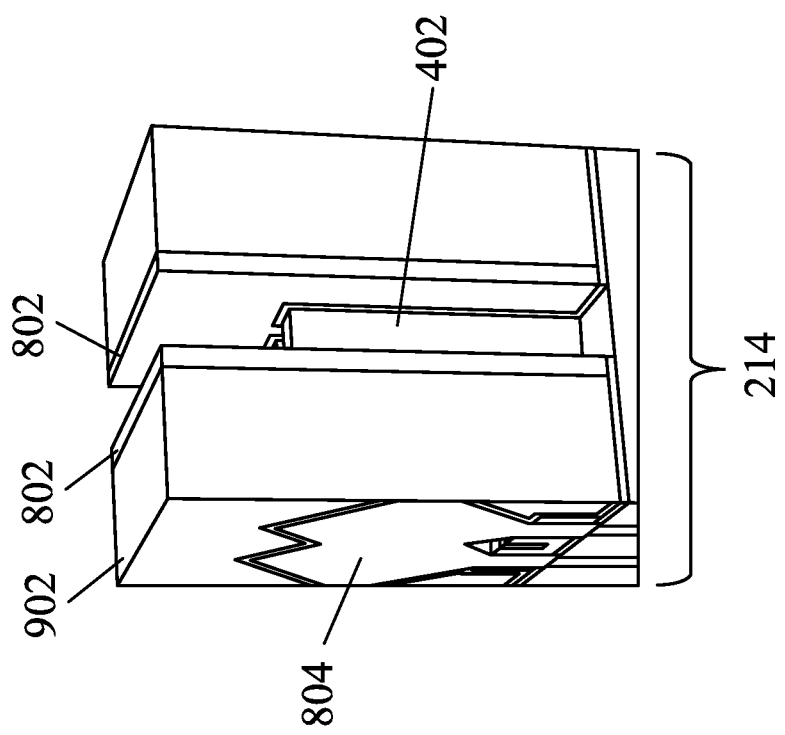
Figure 10A:
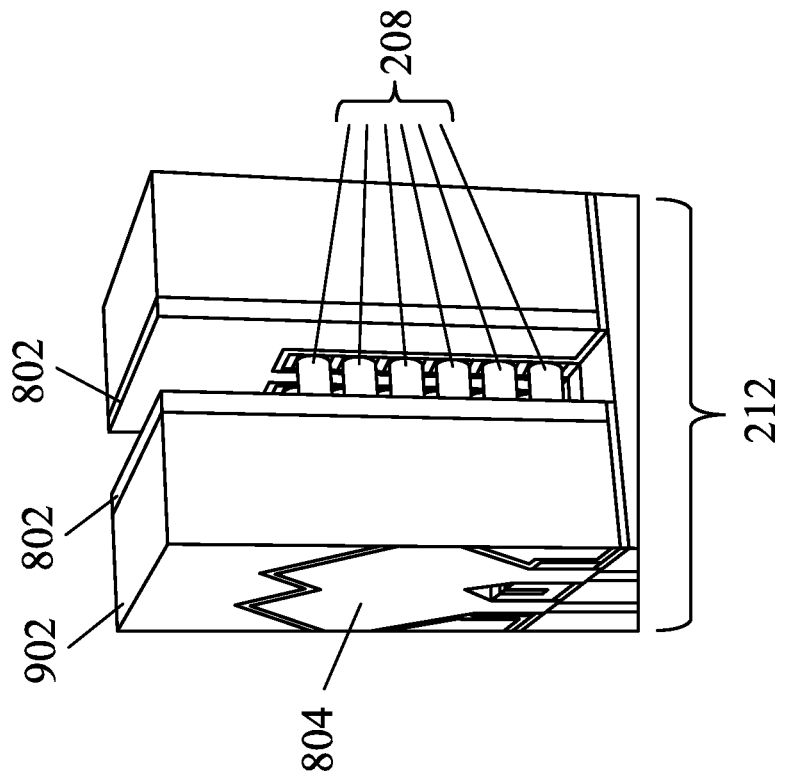
Figure 10C:
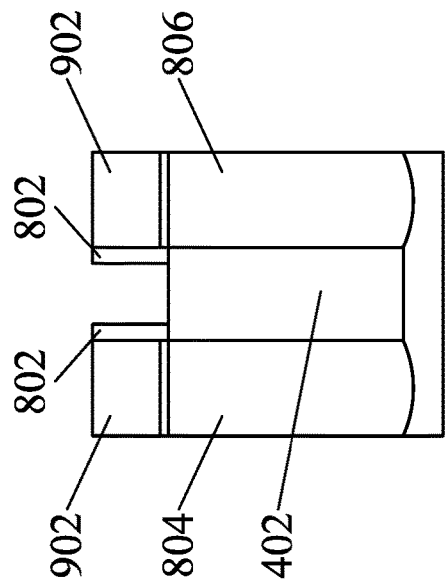
Figure 10D:
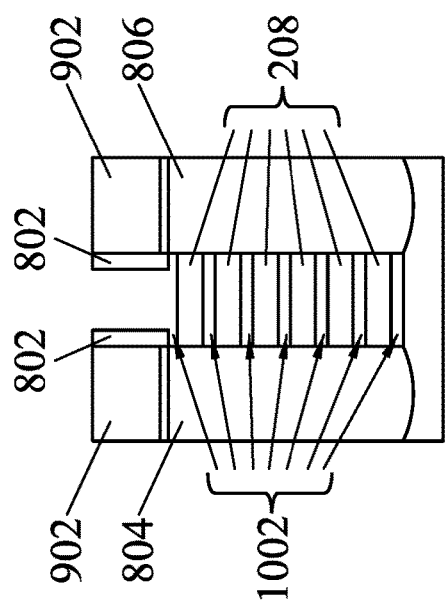
Figure 10E:
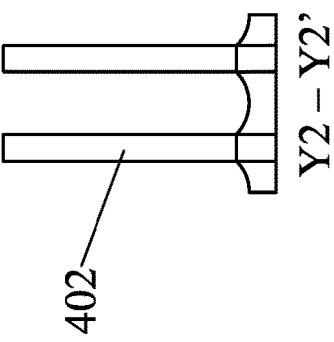
Figure 10F:
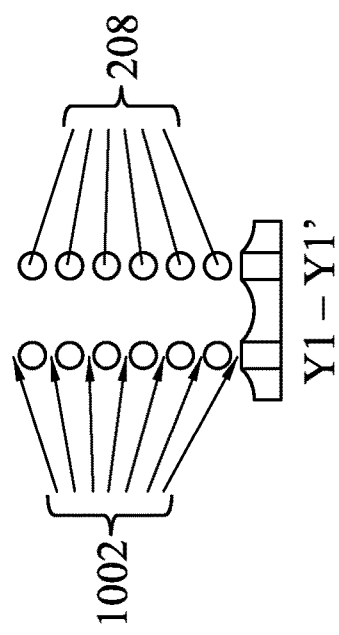

Thereafter, in some examples and in an embodiment of block 122, a selective removal of the epitaxial layer(s) in the channel region of the GAA device in the N-type region 212 is provided. In embodiments, the selected epitaxial layer(s) are removed in the fin elements within the trench provided by the removal of the dummy gate electrode (e.g., the region of the fin on and over which the gate structure will be formed, or the channel region). Referring to the example of FIGS. 10A, 10C, and 10E, the epitaxy layers 206 are removed from the channel region of the substrate 202 and within the trench. In some embodiments, the epitaxial layers 206 are removed by a selective wet etching process. In some embodiments, the selective wet etching includes ammonia and/or ozone. As merely one example, the selective wet etching includes tetra-methyl ammonium hydroxide. (TMAH). In an embodiment, the epitaxial layers 206 are SiGe and the epitaxial layers 208 are silicon, allowing for the selective removal of the SiGe epitaxial layers 206. In some embodiments, the removed epitaxial layers 206 may be referred to as "inner SiGe layers". It is noted that during the interim processing stage of block 122 (e.g., FIGS. 10A, 10C, and 10E), gaps 1002 are provided between the adjacent nanowires in the channel region (e.g., gaps 1002 between epitaxy layers 208). The gaps 1002 may be filled with the ambient environment conditions (e.g., air, nitrogen, etc.). In addition, the gaps 1002 extend beneath the sidewall spacers 802 while abutting the source/drain features 804, 806. In subsequent processing, as described below, merged IL/HK layers are formed between the adjacent nanowires (e.g., between epitaxy layers 208), obviating the need for a dedicated inner spacer layer.

In some embodiments, the block 122 also provides for removal of the dummy gate oxide (e.g., the oxide layer 906) disposed over the fin elements 604 within the P-type region 214. In embodiments, the oxide layer 906 is removed from over the fin elements 604 within the trench provided by the removal of the dummy gate electrode (e.g., the region of the fin on and over which the gate structure will be formed, or the channel region). Referring to the example of FIGS. 10B, 10D, and 10F, the oxide layer 906 is removed from the channel region of the substrate 202 and within the trench of the P-type region 214. In some embodiments, the oxide layer 906 is removed by a wet etching process. In some embodiments, the wet etching includes HF. In various examples, the etching process used to remove the oxide layer 906 may be the same etching process used to remove the epitaxial layers 206. In some cases, the etching process used to remove the oxide layer 906 is different than the etching process used to remove the epitaxial layers 206. When different etching processes are used, the multiple etching processes may be performed in sequence. Thus, after the block 122, portions of the nanowires (epitaxial layers 208) used to form the channel region of an N-type GAA device within the N-type region 212, and portions of the epitaxial layer 402 used to form the channel region of a P-type FinFET within the P-type region 214, are exposed. A gate structure is formed over these exposed channel regions, as discussed below.

The method 100 then proceeds to block 124 where a gate structure is formed. The gate structure may be the gate of a multi-gate transistor, such as a GAA device and/or a FinFET device. The final gate structure may be a high-K/metal gate stack, however other compositions are possible. In some embodiments, the gate structure may form the gate associated with the multi-channels provided by the plurality of nanowires (epitaxial layers 208, now having gaps there between) in the channel region of the N-type GAA device, as well as the gate associated with the channel provided by the epitaxial layer 402 in the channel region of the P-type FinFET.

Figure 11B:
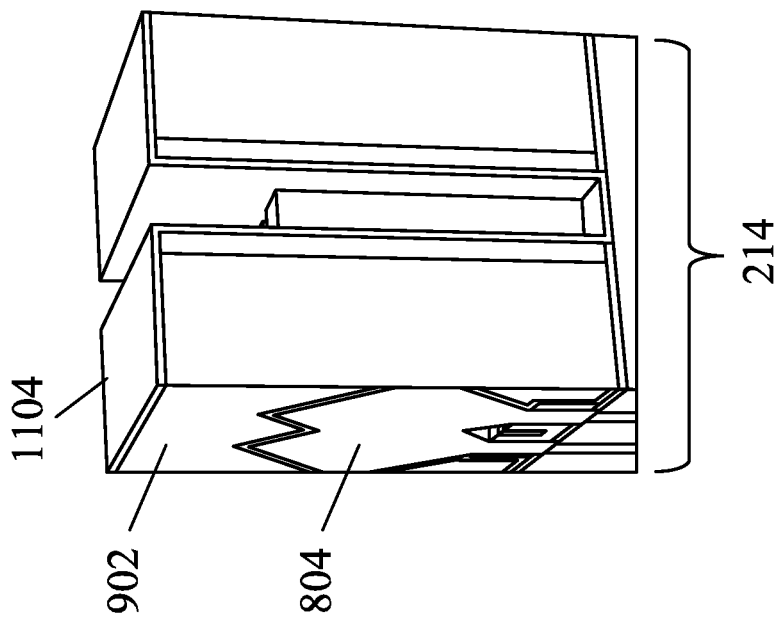
Figure 11A:
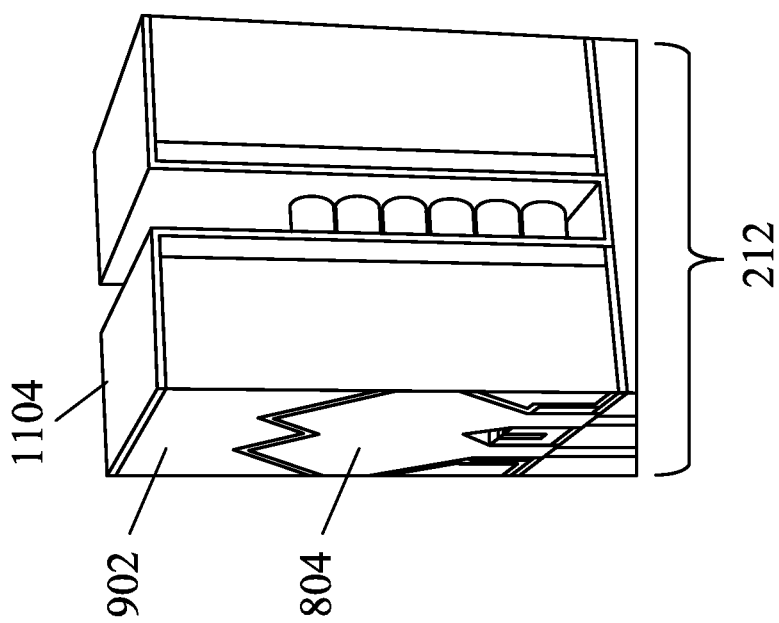
Figure 11D:
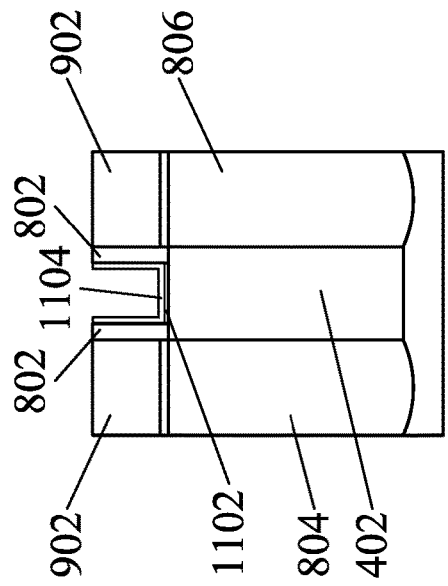
Figure 11C:
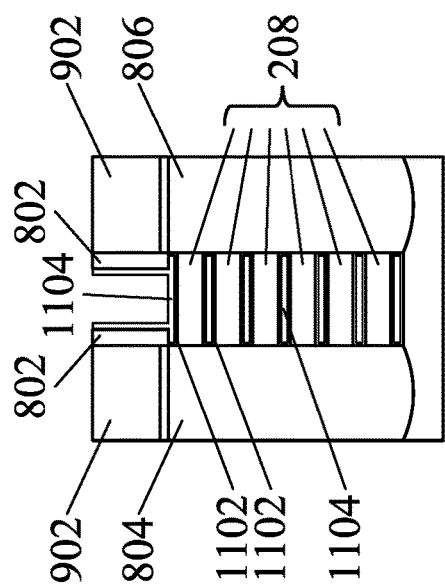
Figure 11F:
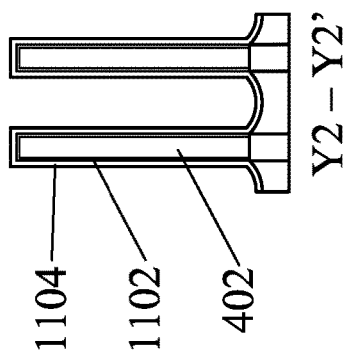
Figure 11E:
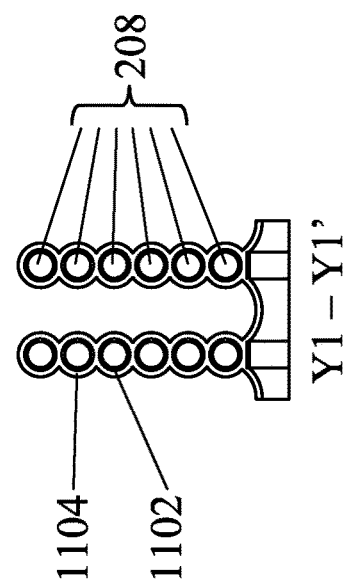

Referring to the example of FIGS. 11A, 11C, and 11E, in an embodiment of block 124, a gate dielectric is formed within the trench of the GAA device, in the N-type region 212, provided by the removal of the dummy gate and/or release of nanowires, described above with reference to block 122. In various embodiments, the gate dielectric includes an interfacial layer (IL) 1102 and a high-K gate dielectric layer 1104 formed over the interfacial layer. The gate dielectric, including the IL 1102 and the high-K gate dielectric layer 1104 over the IL 1102, is also formed within the trench of the FinFET device, in the P-type region 214, provided by the removal of the dummy gate electrode, as shown in the example of FIGS. 11B, 11D, and 11F. High-K gate dielectrics, as used and described herein, include dielectric materials having a high dielectric constant, for example, greater than that of thermal silicon oxide (~3.9).

In some embodiments, the interfacial layer 1102 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-K gate dielectric layer 1104 may include a high-K dielectric layer such as hafnium oxide ($HfO_2$). Alternatively, the high-K gate dielectric layer 1104 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer 1104 may be formed by ALD, physical vapor deposition (PVD), CVD, oxidation, and/or other suitable methods.

With reference now to the example of FIGS. 12A, 12B, 12C, 12D, 12E, and 12F, in a further embodiment of block 124, a metal gate including a metal layer 1202 is formed over the gate dielectric of the GAA device (in the N-type region 212) and over the gate dielectric of the FinFET device (in the P-type region 214). The metal layer 1202 may include a metal, metal alloy, or metal silicide. Additionally, the formation of the gate dielectric/metal gate stack may include depositions to form various gate materials, one or more liner layers, and one or more CMP processes to remove excessive gate materials and thereby planarize a top surface of the semiconductor device 200.

In some embodiments, the metal layer 1202 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer 1202 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer 1202 may be formed by ALD, PVD, CVD, e-beam evaporation, or other suitable process. Further, the metal layer 1202 may be formed separately for N-FET and P-FET transistors which may use different metal layers. In various embodiments, a CMP process may be performed to remove excessive metal from the metal layer 1202, and thereby provide a substantially planar top surface of the metal layer 1202. In addition, the metal layer 1202 may provide an N-type or P-type work function, may serve as a transistor (e.g., GAA or FINFET device) gate electrode, and in at least some embodiments, the metal layer 1202 may include a polysilicon layer. With respect to the GAA device formed in the N-type region 212, the gate structure includes portions that interpose each of the epitaxial layers 208, which each form channels of the GAA device.

It is noted that the GAA device formed in the N-type region 212 does not include an inner spacer layer, in contrast to some existing techniques. As illustrated in FIG. 12C, for example, the spacing between adjacent nanowires (e.g., the epitaxial layer 208) includes merged IL/HK layers (e.g., the interfacial layer 1102 and the high-K gate dielectric layer 1104), without a dedicated inner spacer. As also shown in FIG. 12C, the nanowires (e.g., the epitaxial layer 208) and the merged IL/HK layers extend beneath the sidewall spacers 802 while abutting the source/drain features 804, 806. By simplifying the process to exclude an inner spacer, embodiments of the present disclosure mitigate some key problems associated with inner spacers (e.g., defects/voids in the source/drain epitaxial layer). Thus, device performance will be enhanced. It is also noted that in some embodiments, the spacing between adjacent nanowires (e.g., in a NW-Y direction, as discussed below) may include merged interfacial layers 1102 without the high-K gate dielectric layer 1104. In such cases, the high-K gate dielectric layer 1104 would still be disposed at least on lateral sides (e.g., in a NW-X direction, discussed below) of the nanowires. Additionally, in some examples, an end of the high-K gate dielectric layer 1104, or an end of the interfacial layer 1102, is substantially aligned with an outer lateral surface of the sidewall spacers 802 (e.g., the surface of the sidewall spacers 802 that abuts the ILD layer 902), as shown in FIG. 12C.

Figure 12B:
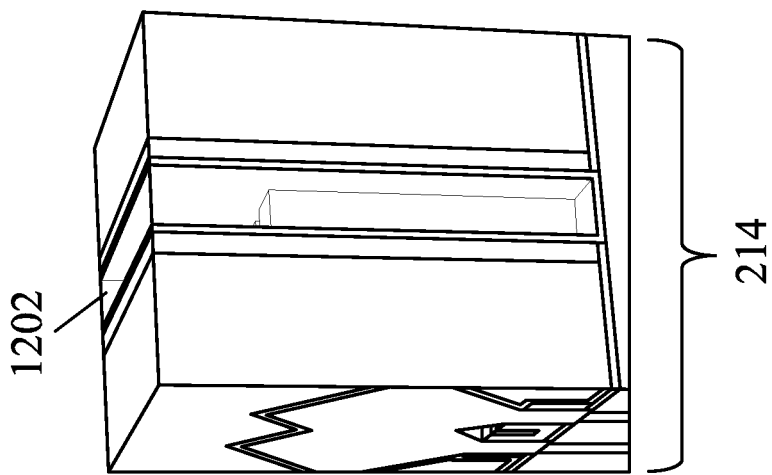
Figure 12A:
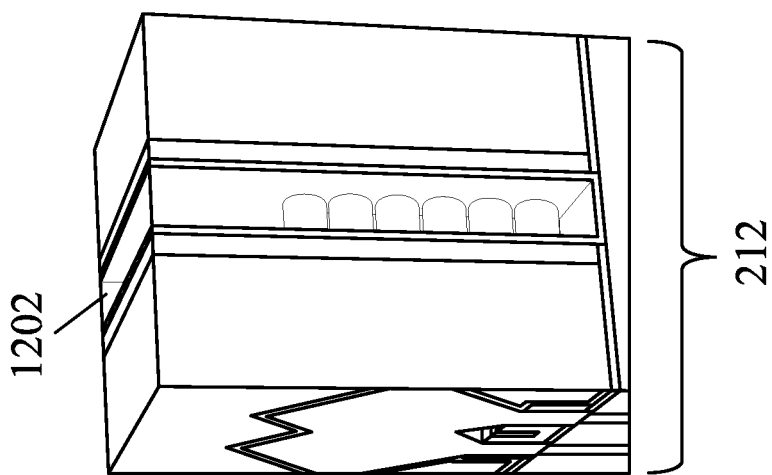
Figure 12G:
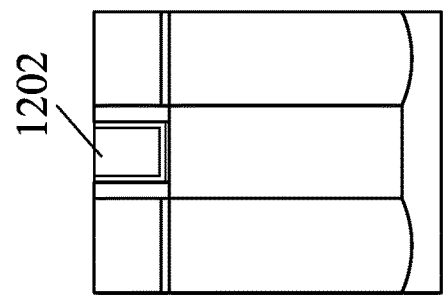
Figure 12G:
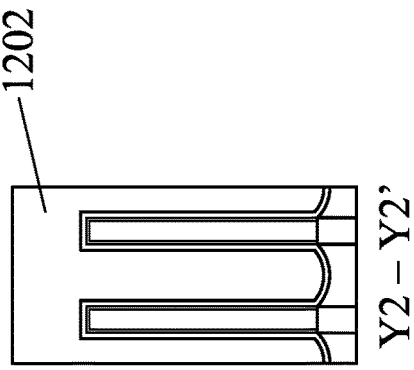
Figure 12G:
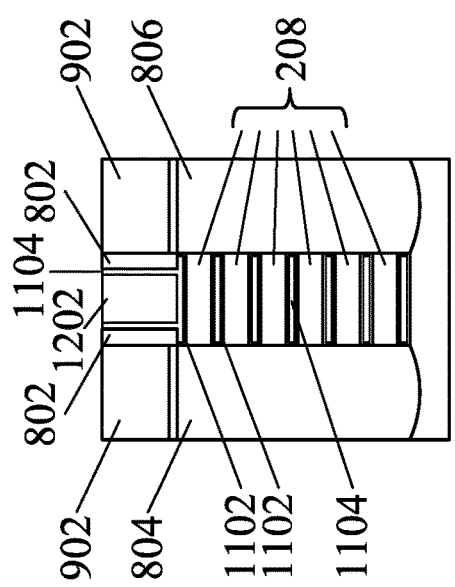
Figure 12G:
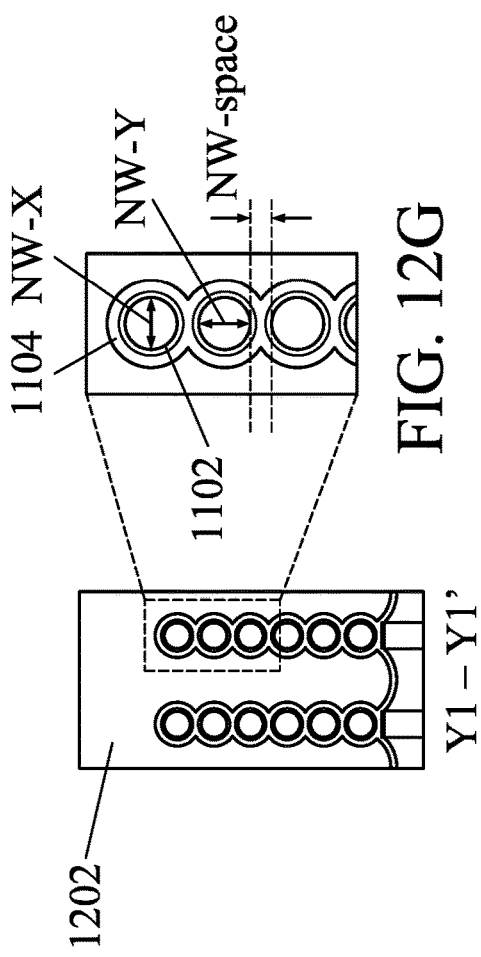

FIG. 12G provides a zoomed-in cross-section view of a portion of FIG. 12E, which more clearly illustrates the structure and sizes of various aspects of the GAA device. In some embodiments, a nanowire X dimension (NW-X) is equal to about 5-14 nm, and a nanowire Y dimension (NW-Y) is equal to about 5-8 nm. In some cases, the nanowire X dimension (NW-X) is substantially the same as the nanowire Y dimension (NW-Y). By way of example, if the nanowire X dimension (NW-X) is greater than the nanowire Y dimension (NW-Y), then the nanowire structure may instead be referred to as a "nanosheet". In some cases, a spacing/gap between adjacent nanowires (NW-space) is equal to about 4-8 nm. It is noted that the spacing/gap between adjacent nanowires (NW-space) is substantially equal to the thickness of the epitaxial layer 206, which was previously disposed between adjacent nanowires, and which was removed at block 122, as discussed above. In some cases, the thickness of the epitaxial layer 206, and thus the resulting spacing/gap between adjacent nanowires, may be chosen to provide a desired thickness of the merged interfacial layer or merged interfacial layer/high-K gate dielectric layer between the adjacent nanowires, to provide complete gap fill between adjacent nanowires that also extends beneath the sidewall spacers 802, and/or to provide a desired number of channel regions for the GAA device (e.g., a smaller spacing between adjacent nanowires may provide for additional epitaxial layers 208, which form the channel regions for the GAA device). In some embodiments, the IL layer 1102 has a thickness of about 0.5-1.5 nm, and the high-K gate dielectric layer 1104 has a thickness of about 1-3 nm.

The semiconductor device 200 may undergo further processing to form various features and regions known in the art. For example, subsequent processing may form contact openings, contact metal, as well as various contacts/vias/lines and multilayer interconnect features (e.g., metal layers and interlayer dielectrics) on the substrate 202, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

For example, while the method 100 has been shown and described as including the device 200 having an N-type GAA device (formed in the N-type region 212) and a complementary P-type FinFET device (formed in the P-type region 214), it will be understood that other device configurations are possible. In some embodiments, the method 100 may be used to fabricate devices having an N-type FinFET device (formed in the N-type region 212) and a complementary P-type GAA device (formed in the P-type region 214). Alternatively, in some cases, the method 100 may be used to fabricate devices having an N-type GAA device (formed in the N-type region 212), as described above, and a complementary P-type GAA device (formed in the P-type region 214). In such cases, although different materials may be used, the P-type GAA device (formed in the P-type region 214) may be formed in a substantially similar manner as described above for fabrication of the N-type GAA device.

With respect to the description provided herein, the present disclosure offers methods and structures for improving a device short-channel effect for advanced transistor structures. In accordance with embodiments of the present disclosure, a process flow and device structure are provided that include a nanowire or nanosheet device for N-type devices (NFETs) and a SiGe FinFET for P-type devices (PFETS). In some embodiments, PFET devices may include a nanowire or nanosheet device, and NFET devices may include FinFET devices. In some cases, both NFET and PFET devices may include nanowire or nanosheet devices. Aspects of the present disclosure, in particular, provide for process flow simplification and performance optimization by providing for interfacial layer (IL)/high-K dielectric (HK) merging between nanowires, thus eliminating the need for an inner spacer. Thus, the various challenges related to the use of inner spacers are mitigated. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method for fabricating a multi-gate semiconductor device including providing a first fin in a first region of a substrate. The first fin includes a plurality of a first type of epitaxial layers and a plurality of a second type of epitaxial layers. The method further includes removing a portion of a layer of the second type of epitaxial layers in a channel region of the first fin to form a first gap between a first layer of the first type of epitaxial layers and a second layer of the first type of epitaxial layers. In some embodiments, the method further includes forming a first portion of a first gate structure within the first gap and extending from a first surface of the first layer of the first type of epitaxial layers to a second surface of the second layer of the first type of epitaxial layers. In some examples, a first source/drain feature is formed abutting the first portion of the first gate structure.

In another of the embodiments, discussed is a method including forming a first fin having a first silicon layer and a second silicon layer. The method may further include forming a first silicon germanium (SiGe) layer interposing the first and second silicon layers. In some embodiments, the method further includes removing a first portion of the first SiGe layer to provide an opening between the first and second silicon layers in a channel region. In some cases, a first source/drain feature is epitaxially grown on the first and second silicon layers and abutting the opening. In some examples, the method further includes forming a first portion of a first gate structure in the opening, where each of the first and second silicon layers adjacent the first gate structure provide a channel.

In yet another of the embodiments, discussed is a multi-gate semiconductor device including a first fin element having a plurality of silicon epitaxial layers. The multi-gate semiconductor device may further include a first gate structure over a channel region of the first fin element, where a portion of the first gate structure is disposed between first and second layers of the plurality of silicon epitaxial layers. In some examples, the multi-gate semiconductor device further includes a spacer disposed on a sidewall of the first gate structure, and a first epitaxial source/drain feature adjacent to the channel region of the first fin element. In some embodiments, the first epitaxial source/drain feature abuts the portion of the first gate structure, and the portion of the first gate structure extends beneath the spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a multi-gate semiconductor device, comprising:
providing a first fin in a first region of a substrate, the first fin having a plurality of a first type of epitaxial layers and a plurality of a second type of epitaxial layers;
removing a portion of a layer of the second type of epitaxial layers in a channel region of the first fin to form a first gap between a first layer of the first type of epitaxial layers and a second layer of the first type of epitaxial layers;

forming a first portion of a first gate structure within the first gap and extending from a first surface of the first layer of the first type of epitaxial layers to a second surface of the second layer of the first type of epitaxial layers, the first portion of the first gate structure formed within the first gap including a lateral end; and forming a first source/drain feature including an epitaxially grown source/drain layer, the lateral end of first portion of the first gate structure both in contact with the epitaxially grown source/drain layer and free of contact with each spacer layer of the multi-gate semiconductor device.

2. The method of claim 1, wherein the first portion of the first gate structure within the first gap includes a merged interfacial layer/high-K gate dielectric layer.

3. The method of claim 1, wherein the providing the first fin includes epitaxially growing the first type of epitaxial layers by growing a silicon layer; and epitaxially growing the second type of epitaxial layers by growing a silicon germanium layer.

4. The method of claim 1, further comprising:

providing a second fin in a second region of the substrate, the second fin including a third type of epitaxial layer;

forming a second portion of a second gate structure over a channel region of the second fin; and forming a second source/drain feature abutting the channel region of the second fin.

5. The method of claim 4, wherein the providing the second fin includes epitaxially growing the third type of epitaxial layer by growing a silicon germanium layer.

6. The method of claim 4, further comprising forming an N-type gate-all-around (GAA) device using the first fin and forming a P-type FinFET device using the second fin.

7. The method of claim 4, further comprising:

before providing the first fin and the second fin, growing an epitaxial stack in the first and second regions of the substrate, the epitaxial stack including the plurality of the first type of epitaxial layers and the plurality of the second type of epitaxial layers;

removing the epitaxial stack from the second region of the substrate to expose an underlying substrate portion;

growing the third type of epitaxial layer on the exposed underlying substrate portion within the second region; and etching the epitaxial stack in the first region to provide the first fin and etching the third type of epitaxial layer in the second region to provide the second fin.

8. The method of claim 1, further comprising:

prior to removing the portion of the layer of the second type of epitaxial layers in the channel region of the first fin to form the first gap, forming a dummy gate stack over the channel region of the first fin; and forming spacers on sidewalls of the dummy gate stack;

wherein the first portion of the first gate structure within the first gap extends beneath the spacers.

9. The method of claim 8, further comprising:

after forming spacers on sidewalls of the dummy gate stack, removing the dummy gate stack; and after removing the dummy gate stack, removing the portion of the layer of the second type of epitaxial layers in the channel region of the first fin to form the first gap.

10. The method of claim 1, further comprising:

providing a second fin in a second region of a substrate, the second fin having a plurality of a third type of epitaxial layers and a plurality of a fourth type of epitaxial layers;

removing a portion of a layer of the fourth type of epitaxial layers in a channel region of the second fin to form a second gap between a first layer of the third type of epitaxial layers and a second layer of the third type of epitaxial layers;

forming a second portion of a second gate structure within the second gap and extending from a third surface of the first layer of the third type of epitaxial layers to a fourth surface of the second layer of the third type of epitaxial layers; and forming a second source/drain feature abutting the second portion of the second gate structure.

11. The method of claim 10, further comprising forming an N-type gate-all-around (GAA) device using the first fin and forming a P-type GAA device using the second fin.

12. A method of fabricating a semiconductor device, comprising:

forming a first fin including a first silicon layer and a second silicon layer;

forming a first silicon germanium (SiGe) layer interposing the first and second silicon layers;

removing a first portion of the first SiGe layer to provide an opening between the first and second silicon layers in a channel region;

epitaxially growing a first source/drain feature on the first and second silicon layers and abutting the opening; and forming a first portion of a first gate structure in the opening, the first portion of the first gate structure both in direct contact with the epitaxially grown first source/drain feature and free of contact with each spacer layer of the semiconductor device, wherein each of the first and second silicon layers adjacent to the first gate structure provide a channel.

13. The method of claim 12, wherein the opening extends beneath a spacer disposed on a sidewall of the first gate structure.

14. The method of claim 12, wherein the first portion of the first gate structure within the opening includes a merged interfacial layer or a merged interfacial layer/high-K gate dielectric layer.

15. The method of claim 12, further comprising:

forming a second fin including a second SiGe layer;

forming a second portion of a second gate structure over a channel region of the second fin; and forming a second source/drain feature abutting the channel region of the second fin.

16. The method of claim 13, wherein the first portion of the first gate structure includes a high-K gate dielectric layer, and wherein an end of the high-K gate dielectric layer is substantially aligned with an outer lateral surface of the spacer.

17. A method, comprising:

forming a first fin in a first substrate region and a second fin in a second substrate region, wherein the first fin includes an epitaxial stack having layers of a first composition interposed by layers of a second composition, and wherein the second fin includes an epitaxial layer having a single composition;

opening a gap within a channel region of the epitaxial stack between adjacent layers of the first composition by removing a portion of an interposing layer of the second composition, wherein the gap extends beneath a gate sidewall spacer; and forming a gate dielectric layer over the first fin and the second fin, wherein the gate dielectric layer substantially fills the gap within the channel region of the epitaxial stack, and wherein an end of the gate dielectric layer that substantially fills the gap directly contacts a portion of a source/drain feature without an interposing spacer layer.

18. The method of claim 17, further comprising:

forming the portion of the source/drain feature that directly contacts the end of the gate dielectric layer that substantially fills the gap.

19. The method of claim 17, wherein the gate dielectric layer that substantially fills the gap within the channel region of the epitaxial stack includes a merged interfacial layer or a merged interfacial layer/high-K gate dielectric layer.

20. The method of claim 17, wherein the end of the gate dielectric layer that substantially fills the gap within the channel region of the epitaxial stack is substantially aligned with an outer lateral surface of the gate sidewall spacer.

* * * * *